United States Patent
Sung

(10) Patent No.: US 6,632,477 B2
(45) Date of Patent: Oct. 14, 2003

(54) SICN COMPOSITIONS AND METHODS

(76) Inventor: Chien-Min Sung, 64 Chung-San Road, Ying-Ko, Taipei County (TW), 23911

( * ) Notice: Subject to any disclaimer, the term of this patent is extended or adjusted under 35 U.S.C. 154(b) by 0 days.

(21) Appl. No.: 09/906,585

(22) Filed: Jul. 16, 2001

(65) Prior Publication Data

US 2003/0012966 A1 Jan. 16, 2003

(51) Int. Cl.⁷ ............................................... C23C 16/36
(52) U.S. Cl. ........................... 427/249.15; 427/255.27; 427/255.28; 427/255.393; 427/255.394; 427/255.4; 427/301
(58) Field of Search ........................ 427/255.27, 249.15, 427/255.28, 255.393, 255.394, 255.4, 301

(56) References Cited

U.S. PATENT DOCUMENTS

| 3,519,472 | A |   | 7/1970  | Dyne et al.      |        |
|-----------|---|---|---------|------------------|--------|
| 4,013,503 | A |   | 3/1977  | Knippenberg et al. |      |
| 4,911,781 | A | * | 3/1990  | Fox et al.       | 117/75 |
| 5,100,847 | A |   | 3/1992  | Li et al.        |        |
| 5,702,822 | A |   | 12/1997 | Terui et al.     |        |
| 5,935,705 | A |   | 8/1999  | Chen et al.      |        |
| 5,997,832 | A | * | 12/1999 | Lieber et al.    | 423/249 |
| 6,090,358 | A |   | 7/2000  | Chen et al.      |        |

* cited by examiner

Primary Examiner—Timothy Meeks
(74) Attorney, Agent, or Firm—Thorpe, North & Western, LLP

(57) ABSTRACT

The present invention provides a method for making a superabrasive composite material having the general formula $Si_xC_yN_z$, and tools containing such a material. In one aspect, vapor forms of Si, C, and N elements are deposited onto a molten metal catalyst and solid $Si_xC_yN_z$ is precipitated therefrom.

37 Claims, No Drawings

SICN COMPOSITIONS AND METHODS

THE FIELD OF THE INVENTION

The present invention relates generally to methods of making a composite $Si_xC_yN_z$ composition, and tools containing such a composition. More particularly, it concerns the use of a vapor-liquid-solid process for making $Si_xC_yN_z$ compositions and tools.

BACKGROUND OF THE INVENTION

Abrasive tools are fundamental items which play a role in many industrial and commercial processes. Saws, drills, grinders, wire drawing dies, and other tools which provide an abrasive action such as cutting, drilling, or grinding have become essential in processes which require material removal. Superabrasives such as diamond and cubic boron nitride (cBN), are much harder than conventional abrasives, and therefore provide superior tool performance characteristics such as wear life and work precision in many instances. Further, many materials such as stone, asphalt, certain metals, and various types of rock or cement are incapable of feasibly being worked using conventional abrasives.

Only a small number of substances or compounds are considered to be "superabrasive," including diamond and cubic boron nitride (cBN). Of the superabrasive materials known, diamond is by far the hardest with the others being significantly less hard. For example, while cBN is considered to be a superabrasive, its hardness is still only about one half that of diamond.

Unfortunately, because of the significant effort required to make or obtain superabrasive materials, prices of superabrasive tools may be prohibitively high. Hence, the acceptance and feasibility of superabrasives is generally limited only to applications in which less durable materials (i.e. conventional abrasives) would be unsuitable.

An additional disadvantage of abrasive materials which have a high carbon content, such as diamond or SiC, is that they are unsuitable for machining a variety of metal materials. Particularly, many metals such as titanium, zirconium, tungsten, iron, cobalt, and nickel are known to react with or dissolve carbon at high temperatures. Thus, only selected metals may be worked with diamond and SiC, such as aluminum, copper, and zinc. Therefore, because of its iron content, steel parts are generally worked using either the (cBN) or the conventional abrasive $Al_2O_3$.

As such, superabrasive materials which are economically feasible, and which may be used over a wide spectrum of industrial applications continue to be sought through ongoing research and development efforts.

SUMMARY OF THE INVENTION

Accordingly, the present invention provides a method of making a superabrasive composite material having the general formula $Si_xC_yN_z$. In one aspect, such a method includes the steps of: depositing a metal containing catalyst on a substrate, heating the substrate to a temperature sufficient to melt the metal containing catalyst, decomposing single bond compounds containing Si, C, and N elements, and depositing the Si, C, and N elements from the single bond compounds onto the molten metal containing catalyst, in an amount sufficient to produce a composite $Si_xC_yN_z$. Such a material may be crystalline or amorphous in form. Further, because of its extreme hardness, such a composite material may be incorporated into a variety of tools requiring super hard components, such as various cutting tools, grinding tools, dressing tools, and light emitting tools, and may present an economically feasible option to cBN or diamond.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying claims, or may be learned by the practice of the invention.

DETAILED DESCRIPTION

Definitions

Before the present SiCN tools and methods are disclosed and described, it is to be understood that the present invention is not limited to the particular process steps and materials disclosed herein, but is extended to equivalents thereof as would be recognized by those ordinarily skilled in the relevant arts. It should also be understood that terminology employed herein is used for the purpose of describing particular embodiments only and is not intended to be limiting.

In describing and claiming the present invention, the following terminology will be used in accordance with the definitions set forth below.

The singular forms "a," and, "the" include plural referents unless the context clearly dictates otherwise. Thus, for example, reference to a superabrasive tool containing "a superabrasive particle" includes one or more of such superabrasive particles, reference to "an element" includes reference to one or more of such elements, and reference to "the catalyst" includes reference to one or more catalysts.

As used herein, "formulation," "composition may be used interchangeably.

As used herein, "compound" refers to a single substance which is formed by the combination of a plurality elements.

As used herein, "composite" refers a material produced by the combination of two or more distinct, yet structurally complimentary components, and which displays structural or functional properties not found in any of the individual components.

As used herein, "single bonding configuration" or "single bonding arrangement" refers to the single bond nature of the bonding arrangement between elements or atoms in a compound. Specifically, a compound with no more than a single bonding configuration contains only single bonds between the included atoms or elements. Such a compound would therefore contain no double or triple bonds between the atoms or elements contained therein.

As used herein, "crystal," or "crystalline" refers to solid SiCN which is formed by a repeating, or substantially repeating, three-dimensional pattern of Si, C, and N elements having a substantially fixed distance therebetween.

As used herein, "amorphous" when used in connection with SiCN refers to a non-crystalline form of such a compound.

As used herein, "molten" refers to the liquid or semi-liquid state of a metal. Such state may be reached in a variety of ways known to those of ordinary skill in the art, such as heating, solvents, pressure, etc.

As used herein, "catalyst" refers to a substance which initiates or accelerates a chemical reaction. In one aspect, such a reaction may include the bonding of Si, C, and N into a composite material.

As used herein, an "effective amount," and "sufficient amount" may be used interchangeably and refer to an amount of a material which, when included in a composition, is sufficient to achieve an intended compositional effect.

As used herein, "X," "Y," and "Z" each refer to a positive integer. As used in connection with a SiCN composite, such integers may represent whole or fractional numbers, which are actual or average values for the designated element of the composite compound.

As used herein, SiCN refers to a composite compound of silicone, carbon, and nitride. Such a composite compound may be either in a crystal form or an amorphous form. Further, the amount of each element in the composite compound may be represented by the use of X, Y, and Z as indicated above.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a range of "about 0.1 to about 25" should be interpreted to include not only the explicitly recited values of 0.1 and 25, but also include individual values and sub-ranges within the indicated range. Thus, included in this numerical range are individual values such as 2, 5, and 6, and sub-ranges such as from 1 to 3, from 2 to 6, from 8 to 18, from 5 to 20, etc.

This same principle applies to ranges reciting only one numerical value. For example, a range recited as "less than about 5.8" should be interpreted to include individual values and sub-ranges which are within the broadly specified range. Furthermore, such an interpretations should apply regardless of the breadth or type of range or the characteristics being described, such as concentration, amount, band gap, etc.

Invention

SiCN is known to have superabrasive properties when each component is present in a certain amount, and may be used as functional alternative to traditional super hard materials, such as diamond and cBN. For example, U.S. Pat. Nos. 5,935,705 and 6,090,358, each of which are incorporated by reference herein, disclose a $Si_xC_yN_z$ compound having a crystalline structure similar to that of a $Si_3N_4$ with X, Y, and Z amounts being X 15–20 at. %, Y 30–40 at. %, and Z 45–55 at. %. Such tools incorporating SiCN may be used over a wider variety of applications than tools which incorporate an abrasive having a high carbon contents such as diamond or SiC.

Applicant has discovered a commercially viable method for the fabrication of a composite compound of SiCN having the general formula $Si_xC_yN_z$. In one aspect of the invention, X may be less than or equal to Y and Z may be greater than X or Y. In another aspect, X may be less than Y. In yet another aspect, X may be 50% less than (less than half of Y). In a further aspect, and Z may be greater than X and Y. In yet another aspect, Z may be greater than the sum of X+Y. In a further aspect, the composite compound formed may have the formula $(SiC)_3N_4$.

SiCN may be produced by the process of the present invention in a variety of forms, including crystalline forms, as well as amorphous forms. In one aspect, the SiCN composite compound may be produced as a crystal. In another aspect, such a crystal may have only single bonds between each element. Crystalline SiCN may be produced in a variety of structures such as hexagonal columns, grits (particles or needles), fibers or whiskers. Such structures may be produced in a variety of sizes. In one aspect, the grits may have a size of from about 10 to about 80 micrometers. In another aspect, the size of the grits may be about 40 micrometers. In yet another aspect, the SiCN composite material may be produced in an amorphous form. Either the crystalline or amorphous form may further be created as a film coating.

A variety of processes have been employed for manufacturing a SiCN compound. The process of the present invention generally employs the a "vapor-liquid-solid" (VLS) process which includes the steps of: depositing a metal containing catalyst on a substrate; heating the substrate to a temperature sufficient to melt the metal containing catalyst; and depositing Si, C, and N elements in vapor form onto the metal containing catalyst in an amount sufficient to produce a composite $Si_xC_yN_z$ material.

A variety of compounds have been synthesized in accordance with a general VLS method. For example, U.S. Pat. Nos. 3,519,472, 4,013,503, 4,911,781, and 5,100,847 each of which is incorporated herein by reference, disclose various aspects of fabricating compounds such as SiC using one or more specific VLS methods.

The temperature required to carry out the SiCN producing reaction of the present invention may be any temperature required by the specific elements used in the process. Those of ordinary skill in the art will be able to readily determine such a temperature without undue experimentation once the specific materials to be used are ascertained. In one aspect, the temperature of the substrate may be from about 500° C. to about 1500° C. In another aspect, the temperature may be from about 800° C. to about 1000° C. In an additional aspect, the temperature may be about 900° C.

In one aspect of the present invention the substrate may fabricated of a variety of materials, including or consisting of a silicon material (Si), such as silicon (111), carbon (C), nitrogen (N), and a variety of metals and metal alloys. By way of example without limitation, suitable metals include or may consist of nickel (Ni), cobalt (Co), iron (Fe), tungsten (W), titanium (Ti), tantalum (Ta), as well as compounds, alloys, and a mixture thereof. In one aspect, the substrate may contain tungsten. In another aspect, the substrate may contain carbon. In a further aspect, the substrate may be an alloy of nickel, cobalt, and iron.

In one aspect of the present invention, the substrate may be a tool body. Any suitable tool shape may be used and can be selected by one of ordinary skill in the art depending on the type of tool desired. In one aspect, the tool body may be a cutting tool, such as a saw, or drill. In another aspect, the tool body may be a grinding tool or a dressing tool, such as a grinding wheel, or CMP pad dresser. In another aspect, the tool body may be a light emitting tool, such as a light emitting diode (LED). In an additional aspect of the invention, a tool having SiCN incorporated therein may be made by adding the SiCN to a tool body, in a separate step after the manufacture of the SiCN composite material. Techniques for such incorporation, including brazing, etc. will be readily recognized by those skilled in the art.

The metal containing catalyst used in the present invention may be selected from a wide variety of metals which are capable of absorbing Si, C, and N elements and catalyzing a reaction wherein the separate elements become bound together into a composite compound. In one aspect, the metal containing catalyst may include or consist of a member selected from the group consisting of: gold (Au), silver (Ag), platinum (Pt), copper (Cu), nickel (Ni), iron (Fe), cobalt(Co), chromium (Cr), manganese (Mn), zinc (Zn), alloys and ions thereof, and mixtures thereof. In another aspect, the metal catalyst may be gold. In yet another aspect, the metal catalyst may be silver. In a further aspect, the metal catalyst may be copper.

The metal containing catalyst may be deposited upon the substrate in a variety of forms, including metal salt forms. In one aspect, the metal containing catalyst may also include one or more halides selected from the group consisting of: fluorine, bromine, chlorine, iodine, and astatine, as well as ions and mixtures thereof. In another aspect, the halide may be chlorine and ions thereof.

The metal containing catalyst may be applied to the substrate using any method known to those skilled in the art, such as sputtering, etc., and may be administered in a variety of forms, including a particulate or powdered forms, as well as in the form of a sheet or foil. As the substrate is heated to the specified reaction temperature, the metal containing catalyst melts and once in a molten state will form discontinuous metal droplets which are suitable for the production of SiCN. The formation of droplets may be further enhanced when a metal salt is used by the exposure of the metal containing catalyst to a high concentration of $H_2$ to reduce the metal salt to a metal. Specifically, the dissipation of the salt portion leaves the metal portion remaining on the substrate.

Notably, the molten metal catalyst may be simply deposited upon the substrate, or may be affixed thereto using a suitable fixing material, such as carbon black. When the molten metal catalyst is not attached to the substrate, epitaxial SiCN growth generally occurs between the substrate and the molten metal catalyst to form a crystalline fiber. However, when the molten metal catalyst is attached to the substrate, crystal growth generally occurs on the upper surface of the catalyst.

Because the crystalline form of SiCN is a single bonding arrangement, it is important that the Si, C, and N elements be provided from raw material sources which contain no more than single bonding arrangements. As such, the production of crystalline SiCN is maximized, while the production of amorphous SiCN is minimized.

A wide variety of compounds contain Si, C, or N elements in a single bonding arrangement as a vapor. In one aspect, the Si, C, and N, elements may be presented as hydride compounds such as $SiH_4$, $CH_4$, and $NH_3$. In another aspect, the Si, C, and N elements may be presented as as halide compounds such as $SiCl_4$, $CCl_4$, and $NCl_3$. In yet another aspect, the Si, C, and N elements may be presented as a combination of hydride and halide compounds.

In one aspect, the Si element may be presented as $SiCl_4$. In another aspect, the Si element may be presented as $SiH_4$. In yet another aspect, the Si element may be presented as SiO. Such silicon monoxide may be obtained from the heat decomposition of $SiO_2$ (common sand). In one aspect, the C element may be provided as $CH_4$. In another aspect, the C element may be provided as $CCl_4$. In one aspect, the N element may be provided as $NH_3$. In another aspect, the N element may be provided as $NCl_3$. Those of ordinary skill in the art will readily recognize equivalent sources of each element which have only single bonding arrangements and which may be deposited upon the metal catalyst as a vapor without introducing elements into the reaction which reduce the effectiveness of the process.

Alternatively, silicon element may be presented as a powder which is deposited upon the substrate in combination with a powdered form of metal containing catalyst material. Alternatively, a sheet or foil of metal containing catalyst material may be laid over a plurality of silicon particles deposited upon the substrate. In this aspect, carbon and nitrogen presented by decomposed carbon and nitrogen compounds, infiltrates through the metal containing catalyst material to combine with the silicone and form SiCN. As such, the size of SiCN grits may be controlled according to the size of the silicon particles.

In order to achieve a $Si_xC_yN_z$ compound wherein X, Y, and Z, are present in specified amounts, as recited above, it is important to control the amount of each element which is introduced into the process. In one aspect, the ratio of Si to C introduced into the process is less than about 1:4. In another aspect, the amount of N introduced into the process is at least twice the amount of the Si and C.

The process of the present invention may be carried out under a variety of physical conditions as will be recognized by those of ordinary skill in the art. Any well known equipment for carrying out processes, such as chemical vapor deposition (CVD), microwave enhanced CVD, or hot filament processes which provide sufficient temperature and pressure conditions to carry out the reaction of the present invention may be used. Other suitable equipment will be recognized by those skilled in the art.

A variety of superabrasive tools may be fabricated which incorporate the SiCN composite composition produced in accordance with the method of the present invention. Saw blades, drills bits, CMP pad dressers, wire drawing dies, cutting inserts, and grinding wheels may all be produced. In one aspect, the SiCN composite composition may be incorporated as superabrasive particles or grits. In another aspect, the SiCN composite material may be incorporated as a film.

In addition to the above-recited durability properties, the SiCN composite material produced by the method of the present invention may have other properties which make it desirable for use in applications other than grinding or cutting. In one aspect, the SiCN composite compound of the present invention may have a direct optical band gap of from about 3.8 to about 4.7 eV. In another aspect, the band gap may be about 4.0 or higher. Such a material may therefore have use in LED and other light emitting applications.

EXAMPLES

The following examples illustrate various embodiments of SiCN composite materials and tools incorporating such material made in accordance with the methods of the present invention.

Example 1

A silicon wafer was sprinkled on the surface with iron powder comprised of particulates having a size of from about 1 to about 20 micrometers in size. The wafer was then placed onto a stage in a chemical vapor deposition chamber fitted with tungsten filaments. The silicon wafer was set at a distance of about 1-centimeter below these filaments. Hydrogen, methane and nitrogen were introduced into the heated chamber with a gas pressure of about 40 torr. The temperature of the hot filament was raised to about 2200° C.; resulting in a substrate temperature of about 1000° C. Heating was continued for about 2 hours. After heating was terminated and the pressure lowered to ambient, the chamber was opened and the substrate removed. It was found that small crystals of SiCN were formed on silicon wafer in contact with residue metal droplets. The particles were tested for hardness by using them to scratch glass and cemented tungsten carbide. Their testing results indicated that the SiCN particles have a hardness sufficient to be used as superabrasive.

Example 2

Cemented tungsten carbide inserts were electroplated with a thin layer of copper. These inserts were used as the substrate for depositing Si—C—N film following a similar procedure as described in the above example. The result was a Si—C—N composite coated cutting tool. This coated tool was found to be much more wear resistant than uncoated insert in turning high silicon aluminum alloy (A390).

Example 3

Gold foil was placed on a silicon substrate, and together they were placed in a microwave chamber where hydrogen, methane, and nitrogen gases were introduced at a pressure of about 90 torr. After heating by the microwave plasma to a temperature over 1000° C. for an hour, SiCN fibers were found to grow profusely on the substrate. The growth rate was estimated to be as high as 1 mm/hr that may be more than an order higher than the growth rate for similar fibers on silicon substrate that contains no gold foil.

It to be understood that the above-described arrangements and protocols are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a superabrasive composite material having the general formula $Si_xC_yN_z$, comprising the steps of:
   a) depositing a particulate form of Si and a metal containing catalyst on a substrate;
   b) heating the substrate to a temperature sufficient to melt the metal containing catalyst; and
   c) depositing C, and N elements in a vapor form onto the molten metal containing catalyst in an amount sufficient to bond with the Si and produce a composite $Si_xC_yN_z$ material in the form of grits.

2. The method of claim 1, wherein the substrate contains an element selected from the group consisting of: Si, C, N, W, Ta, Ti, as well as compounds, alloys, and mixtures thereof.

3. The method of claim 2, wherein the substrate is Si (111).

4. The method of claim 2, wherein the substrate contains C.

5. The method of claim 2, wherein the substrate contains W.

6. The method of claim 1, wherein the substrate is a metal.

7. The method of claim 6, wherein the metal is an alloy of nickel, cobalt, and iron.

8. The method of claim 6, wherein the substrate is a tool body.

9. The method of claim 8, wherein the tool body is a cutting tool body.

10. The method of claim 1, wherein the metal containing catalyst includes a metal salt.

11. The method of claim 10, wherein the metal salt includes a halide.

12. The method of claim 11, wherein the halide is a member selected from the group consisting of: fluorine, chlorine, bromine, iodine, astatine, ions thereof, and mixtures thereof.

13. The method of claim 12, wherein the halide is chlorine or an ion thereof.

14. The method of claim 1, wherein the metal containing catalyst consists of a metal or an alloy thereof.

15. The method of claim 14, wherein the metal is a member selected from the group consisting of: gold, silver, platinum, copper, nickel, iron, cobalt, chromium, manganese, zinc, alloys thereof, and mixtures thereof.

16. The method of claim 15, wherein the metal catalyst is gold.

17. The method of claim 15, wherein the metal catalyst is silver.

18. The method of claim 15, wherein the metal catalyst is copper.

19. The method of claim 1, wherein the metal containing catalyst is fixed to the substrate.

20. The method of claim 1, wherein the Si, C, and N elements are each presented as compounds which contain no more than single bonding arrangements.

21. The method of claim 20, wherein at least one of the Si, C, and N compounds is either a hydride or a halide.

22. The method of claim 21, wherein the C compound is $CH_4$.

23. The method of claim 21, wherein the C compound is $CCl_4$.

24. The method of claim 21, wherein the N compound is $NH_3$.

25. The method of claim 21, wherein the N compound is $NCl_3$.

26. The method of claim 1, wherein the substrate temperature is from about 500° C. to about 1500° C.

27. The method of claim 26, wherein the substrate temperature is from 800° C. to about 1000° C.

28. The method of claim 27, wherein the substrate temperature is about 900° C.

29. The method of claim 1, wherein X is less than or equal to Y and Z is greater than X or Y.

30. The method of claim 29, wherein X is less than Y.

31. The method of claim 30, wherein the X is less than half of Y.

32. The method of claim 1, wherein Z is greater than X+Y.

33. The method of claim 1, wherein the compound has a formula of $(Si, C)_3N_4$.

34. The method of claim 1, wherein the composite material is a crystal having only single bond.

35. The method of claim 1, wherein the grits have a size greater than about 40 micrometers.

36. The method of claim 1, wherein the Si particles have a predetermined size which substantially corresponds to a desired size for the grits.

37. The method of claim 36, wherein the desired size for the grits is about 40 micrometers.

* * * * *